(12) United States Patent
Becklin

(10) Patent No.: US 8,411,446 B2
(45) Date of Patent: Apr. 2, 2013

(54) EQUIPMENT CASE WITH SLIDEOUT RACKS

(75) Inventor: Dennis M. Becklin, Grants Pass, OR (US)

(73) Assignee: Becklin Holdings, Inc., Reno, NV (US)

( * ) Notice: Subject to any disclaimer, the term of this patent is extended or adjusted under 35 U.S.C. 154(b) by 0 days.

(21) Appl. No.: 12/360,518

(22) Filed: Jan. 27, 2009

(65) Prior Publication Data
US 2010/0187148 A1 Jul. 29, 2010

(51) Int. Cl.
H05R 7/20 (2006.01)
H05R 5/00 (2006.01)

(52) U.S. Cl. ......... 361/730; 361/695; 211/26; 206/594

(58) Field of Classification Search ............... 206/594, 206/305, 709, 723, 724, 468, 587, 545, 557, 206/564, 320, 583, 586, 588, 591, 592, 523, 206/521; 211/26; 312/352; 220/4.02; 361/730, 361/695
See application file for complete search history.

(56) References Cited

U.S. PATENT DOCUMENTS

| | | | | |
|---|---|---|---|---|
| 2,557,719 A * | 6/1951 | Bloomstran | | 312/29 |
| 3,059,986 A * | 10/1962 | Miller, Jr. | | 312/334.8 |
| 3,482,895 A * | 12/1969 | Becklin | | 312/352 |
| 3,498,685 A * | 3/1970 | Poplinski | | 384/40 |
| 3,997,819 A * | 12/1976 | Eggert et al. | | 361/704 |
| 4,008,804 A * | 2/1977 | Poggiali | | 206/320 |
| 4,890,938 A * | 1/1990 | Allen et al. | | 384/21 |
| 5,160,357 A * | 11/1992 | Faber | | 55/385.2 |
| 5,493,473 A * | 2/1996 | Yanagi | | 361/695 |
| 5,808,866 A * | 9/1998 | Porter | | 361/695 |
| 7,688,584 B1 * | 3/2010 | Becklin | | 361/694 |
| 2005/0167300 A1 * | 8/2005 | Hamaguchi | | 206/305 |
| 2005/0199459 A1 * | 9/2005 | Harvey | | 190/108 |
| 2006/0018094 A1 * | 1/2006 | Robbins et al. | | 361/695 |
| 2006/0071581 A1 * | 4/2006 | Harvey | | 312/240 |

* cited by examiner

Primary Examiner — J Gregory Pickett
Assistant Examiner — Ernesto Grano
(74) Attorney, Agent, or Firm — Lowe Graham Jones PLLC

(57) ABSTRACT

A container includes an outer case with an interior volume sized to receive an equipment rack assembly, which in turn includes an inner (i.e., movable or slidable) platform assembly slidably coupled to an outer (i.e., non-movable or fixed) isolation assembly fixed to the case. In one example, the inner platform assembly slidably engages the outer isolation assembly using a joint, such as a dove-tail style joint. In addition, the outer isolation assembly may be supported by one or more shock absorbent devices positioned between the outer isolation assembly and the case. The shock absorbent devices may be positioned, oriented and tuned to achieve a desired amount of shock attenuation and damping.

17 Claims, 5 Drawing Sheets

EQUIPMENT CASE WITH SLIDEOUT RACKS

BACKGROUND OF THE INVENTION

Various types of containers for moving equipment, such as electronics equipment or other types of delicate devices or systems, are utilized in military and commercial environments. In a military environment for example, the containers are moved fairly often and the equipment must be packaged, used at a particular site and then re-packaged for further transportation, which may be on a ship, a trucks, an airplane and other vehicle. At anytime during the life of the container it may be subjected to a variety of conditions, such as, but not limited to, vibration loads, impact loads, temperature differentials, pressure differentials, and humidity extremes. To support and protect the equipment, conventional containers may include foam cushioning pads or elastomeric members oriented substantially parallel to the earth's gravitational force to dampen the inertial loading caused by one or more of the above-described load conditions. When transporting precision electronic equipment, for example, it is generally necessary to include bulky packaging to insulate the equipment from shock or vibration even in addition to the aforementioned dampening devices.

SUMMARY OF THE INVENTION

A container includes an outer case with an interior volume sized to receive an equipment rack assembly, which in turn includes an inner (i.e., movable or slidable) platform assembly slidably coupled to an outer (i.e., non-movable or fixed) isolation assembly that is fixed to the case. The inner platform assembly and the outer isolation assembly are slidably coupled together with a joint, such as a dove-tail style joint. In addition, the outer isolation assembly may be supported by one or more shock absorbent devices positioned between the outer isolation assembly and the case. The shock absorbent devices may be positioned, oriented and tuned to achieve a desired amount of shock attenuation and damping.

In one example of the invention, a container for receiving equipment includes an outer case; a outer isolation member fixed to the outer case, the outer isolation member having a plurality of truss-shaped portions arranged together at a desired angle and located between first and second end portions, the outer isolation member further having first engagement portions; a shock absorbent device located between the outer case and at least the first end portion of the outer isolation member, the shock absorbent device having a primary load axis arranged at an angle in a range of about 0 to 90 degrees relative to a horizontal reference plane; and a inner platform member having second engagement portions slidably engageable with the first engagement portions of the outer isolation member, the inner platform member configured to receive the equipment.

In another example of the invention, an assembly receivable into an outer case of an equipment container includes a outer isolation member fixed to an inner surface of the outer case, the outer isolation member having a plurality of truss-shaped portions arranged together at a desired angle and located between first and second end portions, the outer isolation member further having first engagement portions; and a shock absorbent device located between the outer case and at least the first end portion of the outer isolation member, the shock absorbent device having a primary load axis arranged at an angle in a range of about 0 to 90 degrees relative to a horizontal reference plane.

BRIEF DESCRIPTION OF THE DRAWINGS

In the drawings, identical reference numbers identify similar elements or acts. The sizes and relative positions of elements in the drawings may not be necessarily drawn to scale. For example, the shapes of various elements and angles may not be drawn to scale, and some of these elements may be arbitrarily enlarged or positioned to improve drawing legibility.

The preferred and alternative embodiments of the present invention are described in detail below with reference to the following drawings.

DETAILED DESCRIPTION OF THE PREFERRED EMBODIMENT

In the following description, certain specific details are set forth in order to provide a thorough understanding of various embodiments of the invention. However, one skilled in the art will understand that the invention may be practiced without these details. In other instances, well-known structures associated with equipment containers, shock absorbent devices and methods of assembling the same have not necessarily been shown or described in detail to avoid unnecessarily obscuring descriptions of the embodiments of the invention.

In addition, throughout the specification and claims which follow, the terms "container" is meant as a broad term that includes a variety of structures having an interior space sized to receive "equipment," which in turn is also defined broadly as being any of a variety of items, such as, but not limited to, computer, electronic, optical, or other equipment that may be otherwise susceptible to damage if not properly stored in the container. Further, the term "container" as used herein generally may include structurally rigid containers that may be stacked together.

Figure 1:
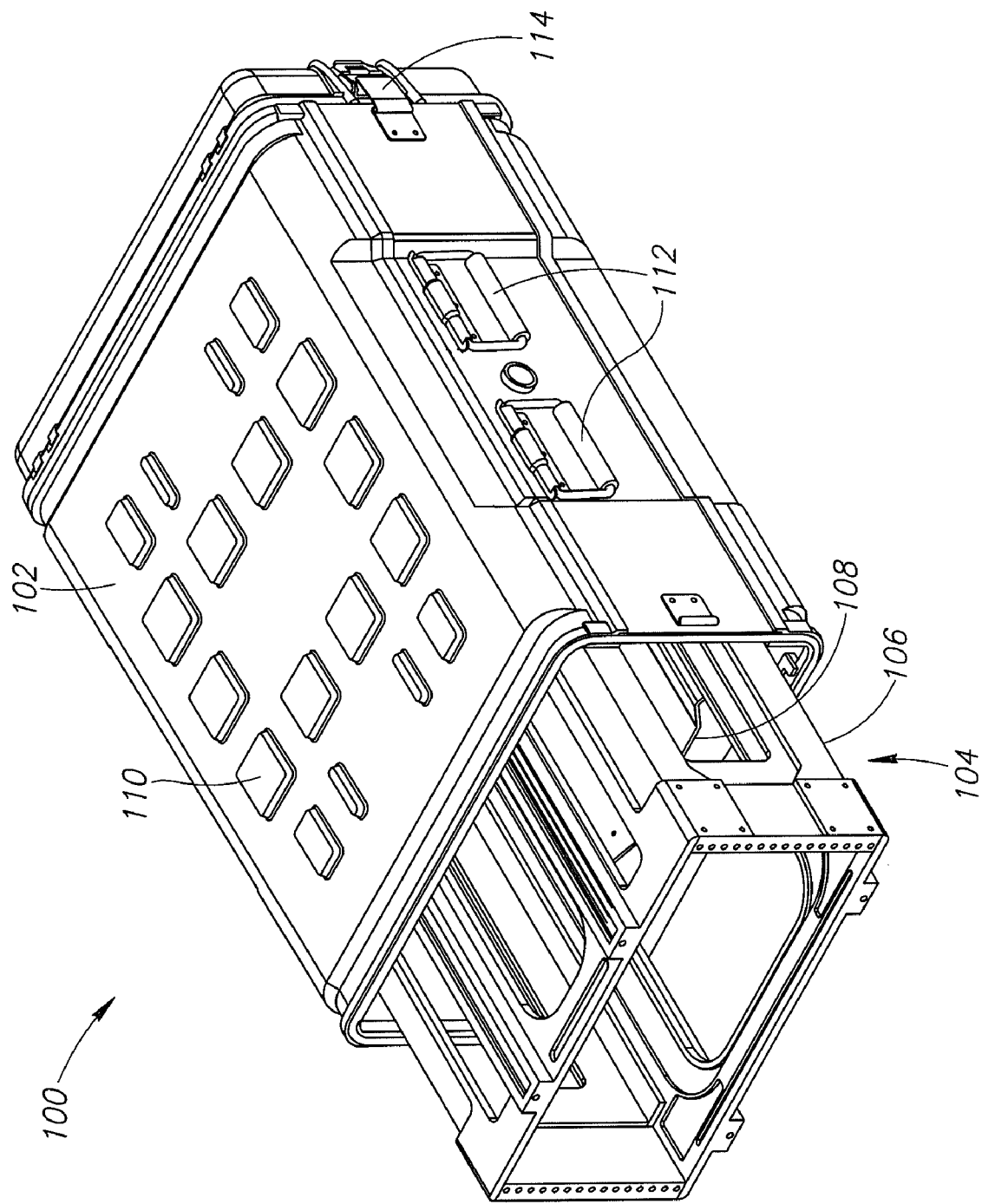
FIG. 1 is an isometric view of an equipment case having an equipment rack assembly that includes a fixed outer isolation assembly and a movable inner platform assembly where the outer isolation assembly is supported by a shock absorbent device according to an embodiment of the present invention.

FIG. 1 shows a container 100 having an outer case 102 with an interior volume sized to receive an equipment rack assembly 104 according to an embodiment of the present invention. The equipment rack assembly 104 includes an inner (i.e., movable or slidable) platform assembly 106 and an outer (i.e., non-movable or fixed) platform assembly 108, both of which will be described in greater detail below. The outer case 102 may include a plurality of stacking elements 110 arranged in a desired pattern. In addition, the container 100 may include handles 112 and latch mechanisms 114. The various components or parts of the equipment rack assembly 104 may be made out of fiber reinforced composite materials to achieve a desired balance at least between strength, toughness and weight.

Figure 2:
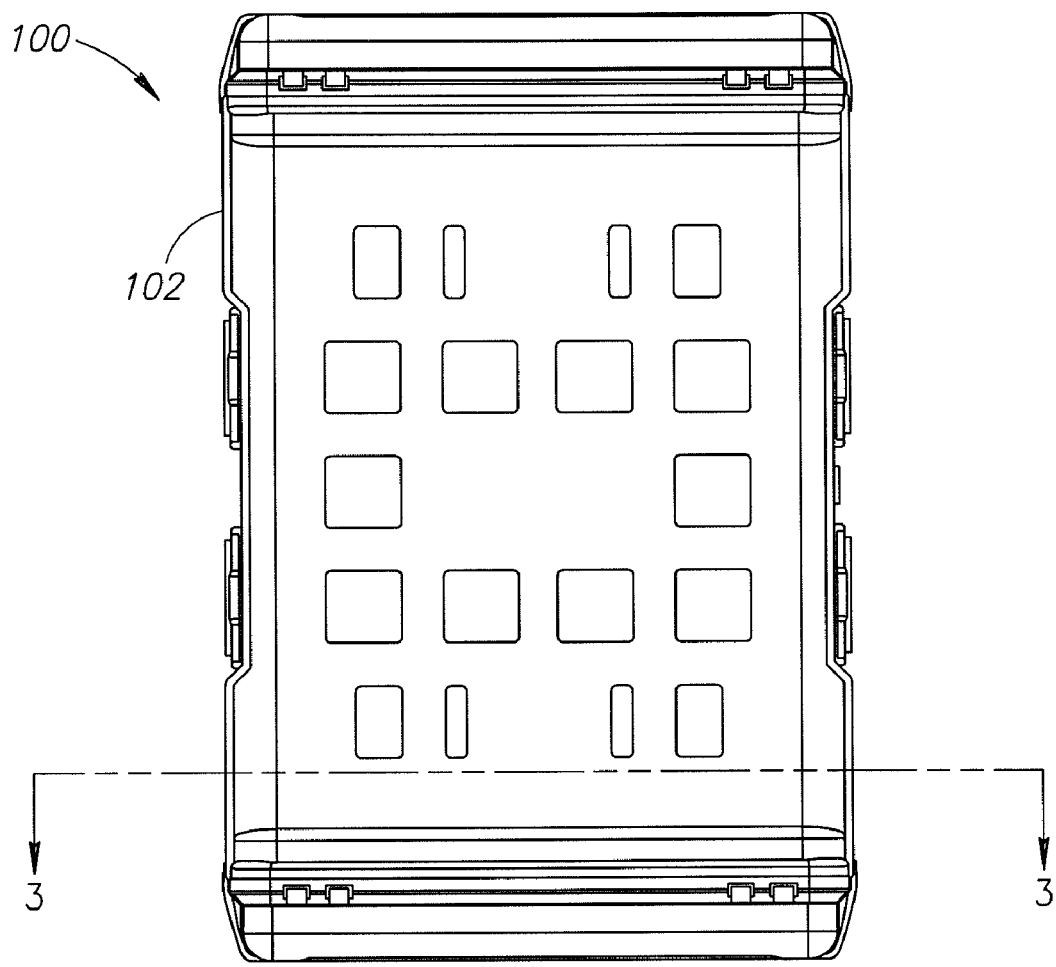
FIG. 2 is a top plan view of the equipment case of FIG. 1.
Figure 3:
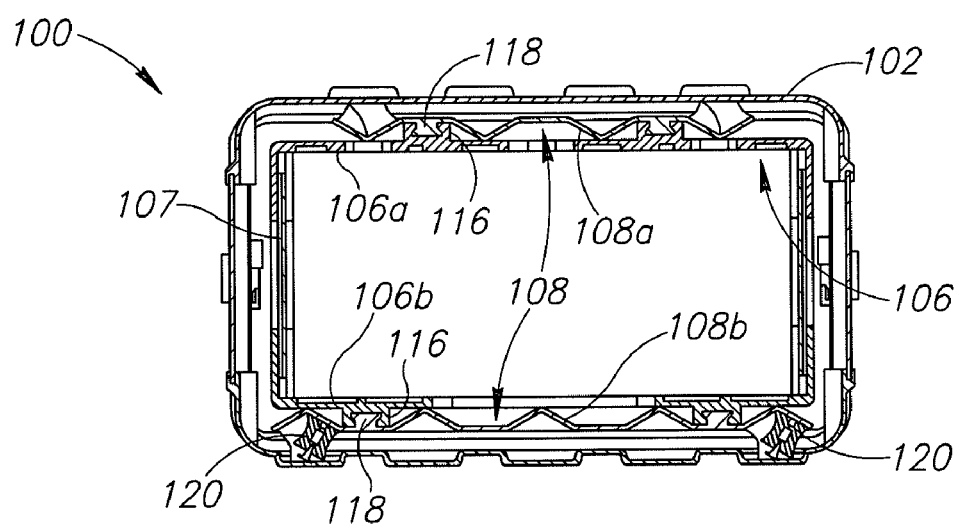
FIG. 3 is a cross-sectional view of the equipment case of FIG. 1 taken along line 3-3 of FIG. 2.

FIGS. 2 and 3 show the container 100, and specifically FIG. 3 shows a cross-sectional view through the container 100 taken along line 3-3 of FIG. 2. The inner platform assembly 106 includes an upper portion 106a coupled to a lower portion 106b with vertical members 107 extending there between. The inner platform assembly 106 slidably engages and is received within the outer isolation assembly 108, which includes upper and lower plate members 108a, 108b, respectively. In the illustrated embodiment, the inner platform assembly 106 includes first engagement portions 116 that slidably engage with corresponding second engagement portions 118 of the outer isolation assembly 108. By way of example, the engagement portions 116, 118 may take the form of a sliding dove-tail joint, and more specifically the first engagement portions 116 may operate as the socket or receiving portions 116 of the dove-tail joint while the second engagement portions 118 may operate as the tail or insertable portions 118 of the dove-tail joint.

In the illustrated embodiment, at least one shock absorbent device 120 is located between the outer isolation assembly 108 and the outer case 102. In one embodiment eight shock absorbent devices 120 are arranged between the outer isolation assembly 108 and the outer case 102. The shock absorbent device 120 may have a solid body made from an elastomeric material having a selected durometer. The size and properties of the shock absorbent device 120 may be modified, determined or otherwise selected depending on the weight of the equipment (not shown) to be received and/or transported by the container 100, the type of equipment, the anticipated operational loads expected for the container 100, and other considerations.

Figure 4:
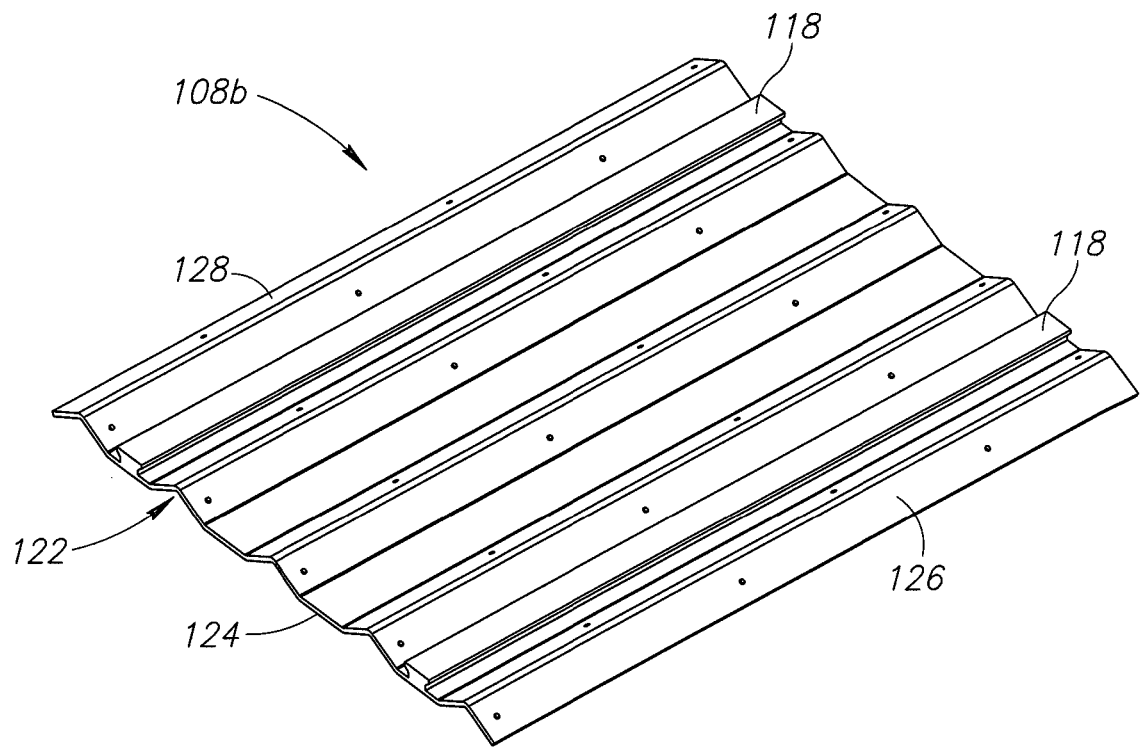
FIG. 4 is an isometric view of the outer isolation assembly of the equipment case of FIG. 1.
Figure 5:
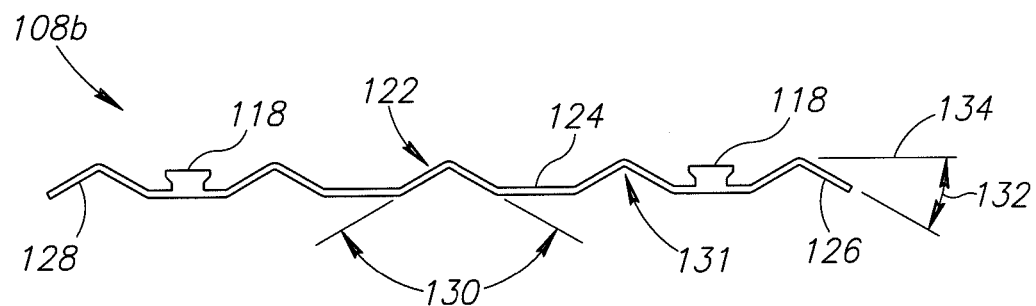
FIG. 5 is a side elevational view of the outer isolation assembly of FIG. 4.

FIGS. 4 and 5 show the lower plate member 108b of the outer isolation assembly 108 having truss-shaped portions 122 and planar portions 124 located between first and second end portions 126, 128. In the illustrated embodiment, the lower plate member 108b includes engagement portions 118 that take the form of the tail or insertable portion of the dove-tail joint, as described above. The truss-shaped portions 122 are arranged or formed together at a desired angle 130, which is in a range of about 90-150 degrees as applied in the apex 131 of the truss-shaped portion 122. Again referring to the illustrated example, the desired angle 130 is about 120 degrees. The end portions 126, 128 may extend at an angle 132, which may be in a range of about 0 to 90 degrees relative to a horizontal reference plane 134. The upper plate member 108a of the outer isolation assembly 108 may have a similar, if not identical, configuration as the lower plate member 108b.

Figure 6:
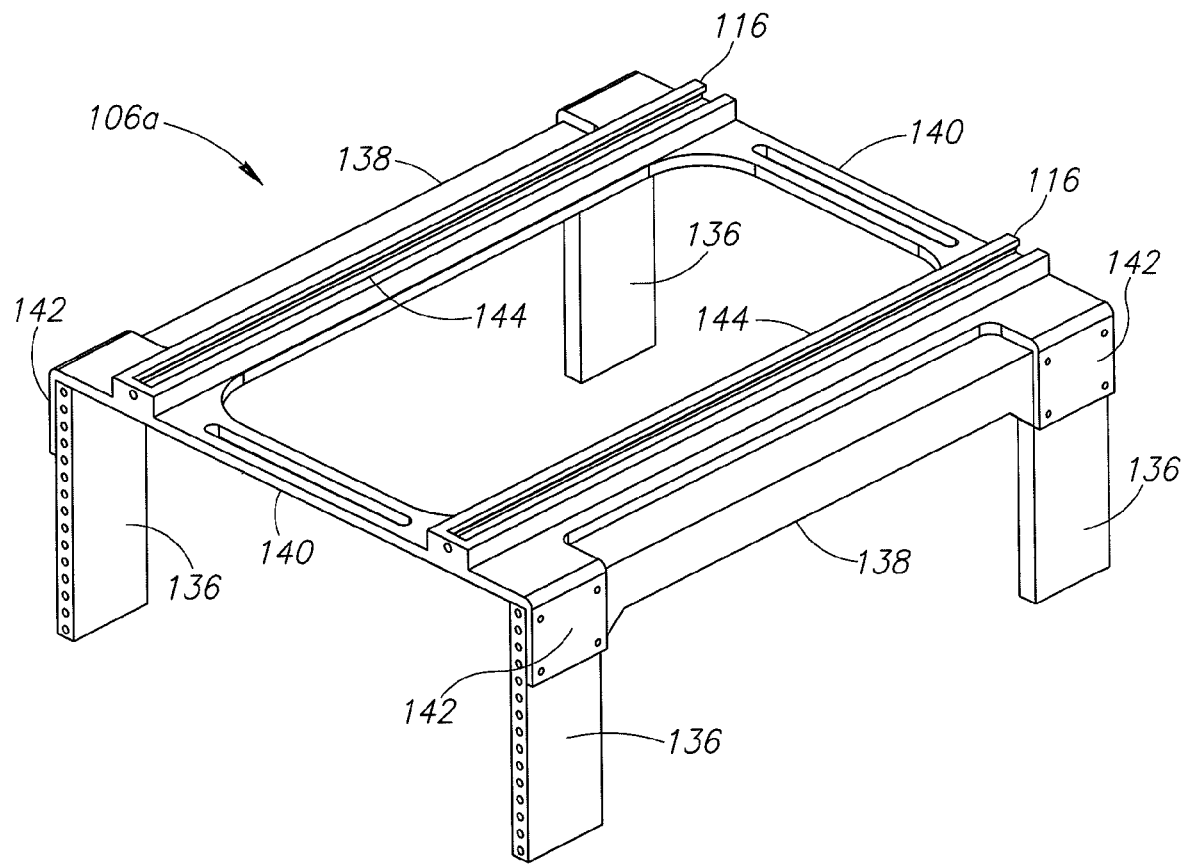
FIG. 6 is an isometric view of the inner platform assembly of the equipment case of FIG. 1.

FIG. 6 shows the upper portion 106a of the inner platform assembly 106 having vertical members 136 coupled to and extending from the upper portion 106a for attachment to the lower portion 106b (FIG. 3). Further, the upper portion 106a includes longitudinal members 138 coupled to transverse members 140. In one embodiment the longitudinal members 138 are integrally formed or molded with the transverse members 140. The vertical members 136 are coupled to and extend from flanges 142. The upper portion 106a includes slide rails 144, which in turn include the first engagement portions 116 described above, which may take the form of the socket or receiving portions 116 for the dove-tail joint. The lower portion 106b may have a similar, if not identical, configuration as compared to the upper portion 106a.

Figure 7:
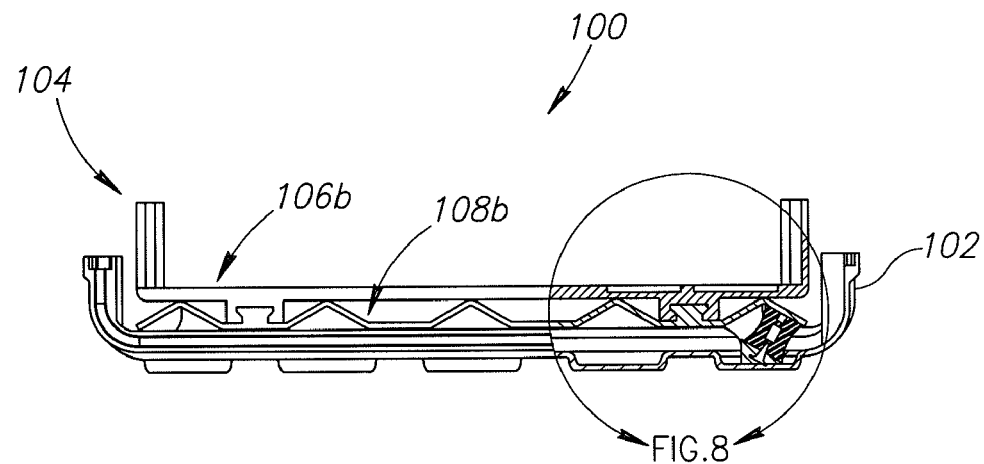
FIG. 7 is a cross-sectional view through a lower portion of the equipment case of FIG. 1.
Figure 8:
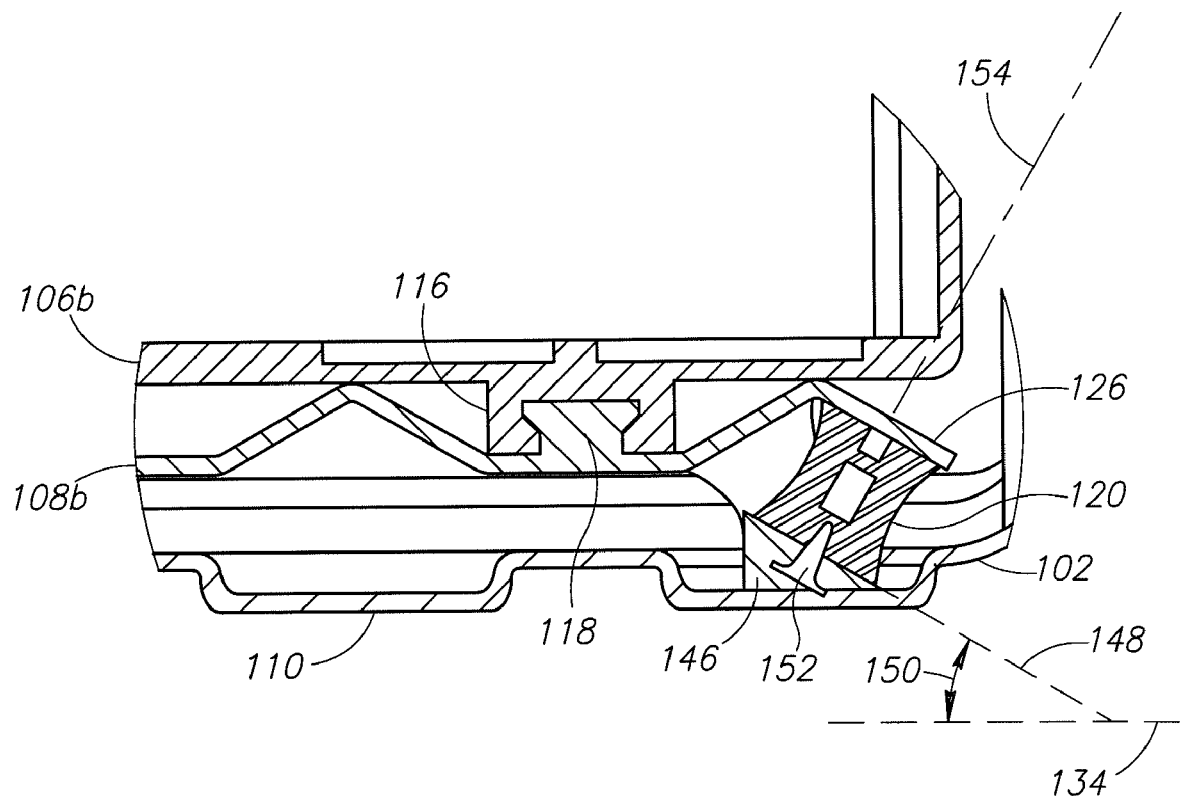
FIG. 8 is a close-up view of the lower portion of the equipment case as identified in FIG. 7.

FIGS. 7 and 8 show a portion of the container 100, and more specifically a lower portion of the equipment rack assembly 104 with the lower portion 106b and the lower portion 108b located in the outer case 102. Referring to FIG. 8, the shock absorbent device 120 is located between the end portion 126 of the lower portion 108b and a gusset 146 is coupled to the outer case 102. The gusset 146 may be integrally formed or molded into the outer case 102 and includes a ramped surface oriented along plane 148, which forms an angle 150 relative with the horizontal reference plane 134. In one embodiment, the angle 150 is a complementary angle with respect to the angle 132 (FIG. 5). The shock absorbent device 120 may be secured between the end portion 126 and the gusset 146 through a variety of mechanical means 152, which may include, but is not limited to fastening, bonding, compression fitting, etc. In one embodiment, a primary load axis 154 of the shock absorbent device 120 is oriented to achieve a desired amount of shock attenuation.

Although only one shock absorbent device 120 is illustrated in FIGS. 7 and 8, it is appreciated that the configuration of the lower portion 108b, in particular, permits a plurality of shock absorbent device 120 to be located between the case 102 and the lower portion 108b. In addition, if multiple shock absorbent devices 120 are used, each device may be specifically tuned to achieve an overall desired amount of shock attenuation and damping. In one embodiment, the tuning of the shock absorbent devices 120 may take the form of selecting shock absorbent devices 120 having different properties, such as different durometers, different thicknesses, different materials, etc.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A container for receiving equipment, the container comprising:
    an outer case;
    an isolation panel fixed to the outer case, the isolation panel having truss-shaped portions contiguously arranged between first and second end portions, wherein the individual truss-shaped portions have an apex and a base, and wherein a distance between the apex and the base, as measured in a direction generally perpendicular to the isolation panel, defines a thickness of the isolation panel, the isolation panel further having a slide engagement member adjacent to at least one truss-shaped portion, wherein the slide engagement member is positioned at least partially between the apex and the base of the truss-shaped portions;
    a shock absorbent device located between the outer case and the isolation panel, the shock absorbent device having a primary load axis arranged at a desired angle relative to a horizontal reference plane; and
    an inner member having an elongated guide member configured with a channel to slidably engage the slide engagement member of the isolation panel, the inner member sized to be received in the outer case.

2. The container of claim 1, wherein the slide engagement member and the elongated guide member cooperate together as a dovetail-style joint.

3. The container of claim 1, wherein the shock absorbent device includes a solid body made from an elastomeric material having a selected durometer.

4. The container of claim 1, wherein the desired angle of the primary load axis of the shock absorbent device is in a range of about 0 to about 90 degrees relative to the horizontal reference plane.

5. The container of claim 4, wherein the desired angle of the primary load axis of the shock absorbent device is about 45 degrees relative to the horizontal reference plane.

6. The container of claim 4, wherein the desired angle of the primary load axis of the shock absorbent device is about 30 degrees relative to the horizontal reference plane.

7. The container of claim 1, wherein the desired angle of the at least one truss-shaped portion is an obtuse angle.

8. The container of claim 1, the panel includes at least one planar portion proximate at least one truss-shaped portion.

9. An assembly receivable into an outer case of an equipment container, the assembly comprising:

an isolation plate fixed to an inner surface of the outer case, the isolation plate configured with ridges contiguously arranged between first and second end portions, the plate having at least one planar portion located adjacent one of the ridges, the plate further having a slide member coupled to the planar portion and extending generally parallel with the ridges, wherein the slide member extends from the planar portion a first distance in a direction generally perpendicular to the isolation plate, and wherein the ridges extend from the isolation plate a second distance in the direction generally perpendicular to the isolation plate, and further wherein the second distance is greater than the first distance; and a shock absorbent device positionable between the outer case and the isolation member, the shock absorbent device having a primary load axis arranged at an angle that is substantially perpendicular to a surface of one of the ridges.

10. The assembly of claim 9, further comprising an inner member having an engagement portion configured to slidably engage with the slide member of the isolation plate, the inner member configured to receive the equipment.

11. The assembly of claim 10, wherein the slide member and the engagement portion are configured as a dovetail-style joint.

12. The assembly of claim 9, wherein the shock absorbent device includes a solid body made from an elastomeric material having a selected durometer.

13. The assembly of claim 9, wherein the desired angle of the primary load axis of the shock absorbent device is in a range of about 0 to about 90 degrees relative to a horizontal reference plane.

14. The assembly of claim 13, wherein the desired angle of the primary load axis of the shock absorbent device is about 45 degrees relative to the horizontal reference plane.

15. The assembly of claim 13, wherein the desired angle of the primary load axis of the shock absorbent device is about 30 degrees relative to the horizontal reference plane.

16. The assembly of claim 9, wherein adjacent ridge surfaces form an apex intersection with an obtuse angle.

17. The assembly of claim 9, wherein the shock absorbent device includes a variable spring rate.

* * * * *